United States Patent
Fleming et al.

(10) Patent No.: US 9,839,155 B2
(45) Date of Patent: Dec. 5, 2017

(54) THERMAL DUCTING SYSTEM

(71) Applicant: Panduit Corp., Tinley Park, IL (US)

(72) Inventors: James N. Fleming, Naperville, IL (US); Timothy Goldsberry, Orland Hills, IL (US); Mark Shurhay, Western Springs, IL (US); Max W. Hibner, Glenview, IL (US)

(73) Assignee: Panduit Corp., Tinley Park, IL (US)

( * ) Notice: Subject to any disclaimer, the term of this patent is extended or adjusted under 35 U.S.C. 154(b) by 938 days.

(21) Appl. No.: 13/891,351

(22) Filed: May 10, 2013

(65) Prior Publication Data

US 2013/0309957 A1 Nov. 21, 2013

Related U.S. Application Data

(60) Provisional application No. 61/647,557, filed on May 16, 2012.

(51) Int. Cl.
*H05K 7/20* (2006.01)
*B23P 19/00* (2006.01)

(52) U.S. Cl.
CPC .......... *H05K 7/20145* (2013.01); *B23P 19/00* (2013.01); *H05K 7/20736* (2013.01); *Y10T 29/49826* (2015.01)

(58) Field of Classification Search
CPC ....................................................... H05K 7/20
USPC ....................................................... 454/184
See application file for complete search history.

(56) References Cited

U.S. PATENT DOCUMENTS

| | | |
|---|---|---|
| 3,016,813 A | 1/1962 | Frasier et al. |
| 3,120,166 A | 2/1964 | Lyman |
| 3,387,648 A | 6/1968 | Ward, Jr. et al. |
| 3,874,444 A | 4/1975 | Perce et al. |
| 3,903,404 A | 9/1975 | Beall et al. |
| 3,985,295 A | 10/1976 | Monninger |
| 4,089,040 A | 5/1978 | Paulsen |
| 4,158,875 A | 6/1979 | Tajima et al. |
| 4,399,485 A | 8/1983 | Wright et al. |
| 4,489,363 A | 12/1984 | Goldberg |
| 4,665,466 A | 5/1987 | Green |
| 4,774,631 A | 9/1988 | Okuyama et al. |

(Continued)

FOREIGN PATENT DOCUMENTS

| | | |
|---|---|---|
| DE | 3316978 A1 | 11/1984 |
| DE | 19728306 A1 | 1/1999 |

(Continued)

OTHER PUBLICATIONS

NetShelter® Side Airflow Duct Kit (AR7715) Installation; Schneider Electric; 8 pages; Jul. 2009.

(Continued)

*Primary Examiner* — Steven B McAllister
*Assistant Examiner* — Samantha Miller
(74) *Attorney, Agent, or Firm* — Christopher S. Clancy; James H. Williams; Christopher K. Marlow

(57) ABSTRACT

A thermal ducting system for electronic equipment in an electronic equipment enclosure is provided. The thermal ducting system includes a top duct, a bottom duct spaced apart from the top duct, a side duct extending from the top duct to the bottom duct and along an intake side of the electronic equipment, and at least one baffle positioned in the side duct.

14 Claims, 4 Drawing Sheets

(56) References Cited

U.S. PATENT DOCUMENTS

| | | |
|---|---|---|
| 4,851,965 A | 7/1989 | Gabuzda et al. |
| 4,935,845 A | 6/1990 | Schwehr et al. |
| 4,967,155 A | 10/1990 | Magnuson |
| 5,054,545 A | 10/1991 | Ghaemian |
| 5,103,374 A | 4/1992 | Azar |
| 5,105,336 A | 4/1992 | Jacoby et al. |
| 5,216,579 A | 6/1993 | Basara et al. |
| 5,440,450 A | 8/1995 | Lau et al. |
| 5,460,441 A | 10/1995 | Hastings et al. |
| 5,481,429 A | 1/1996 | Eriksson et al. |
| 5,528,454 A | 6/1996 | Niklos |
| 5,544,012 A | 8/1996 | Koike |
| 5,570,740 A | 11/1996 | Flores et al. |
| 5,657,641 A | 8/1997 | Cunningham et al. |
| 5,671,805 A | 9/1997 | Ståhl et al. |
| 5,718,628 A | 2/1998 | Nakazato et al. |
| 5,765,743 A | 6/1998 | Sakiura et al. |
| 5,860,291 A | 1/1999 | Johnson et al. |
| 5,903,433 A | 5/1999 | Gudmundsson |
| 5,934,368 A | 8/1999 | Tanaka et al. |
| 6,052,282 A | 4/2000 | Sugiyama et al. |
| 6,064,571 A | 5/2000 | Noble |
| 6,067,223 A | 5/2000 | Diebel et al. |
| 6,151,210 A | 11/2000 | Cercioglu et al. |
| 6,163,453 A | 12/2000 | Hou et al. |
| 6,163,454 A | 12/2000 | Strickler |
| 6,164,369 A | 12/2000 | Stoller |
| 6,185,098 B1 | 2/2001 | Benavides |
| 6,186,890 B1 | 2/2001 | French et al. |
| 6,198,628 B1 | 3/2001 | Smith |
| 6,222,729 B1 | 4/2001 | Yoshikawa |
| 6,285,546 B1 | 9/2001 | Watarai et al. |
| 6,309,295 B1 | 10/2001 | Clarke et al. |
| 6,366,461 B1 | 4/2002 | Pautsch et al. |
| 6,400,567 B1 | 6/2002 | McKeen et al. |
| 6,412,292 B2 | 7/2002 | Spinazzola et al. |
| 6,417,443 B1 | 7/2002 | Smith |
| 6,445,586 B1 | 9/2002 | Chou |
| 6,459,579 B1 | 10/2002 | Farmer et al. |
| 6,463,997 B1 | 10/2002 | Nicolai et al. |
| 6,494,050 B2 | 12/2002 | Spinazzola et al. |
| 6,494,252 B1 | 12/2002 | Takala et al. |
| 6,494,779 B1 | 12/2002 | Nicolai et al. |
| 6,504,714 B1 | 1/2003 | Richter |
| 6,512,672 B1 | 1/2003 | Chen |
| 6,516,954 B2 | 2/2003 | Broome |
| 6,535,382 B2 | 3/2003 | Bishop et al. |
| 6,554,697 B1 | 4/2003 | Koplin |
| 6,557,357 B2 | 5/2003 | Spinazzola et al. |
| 6,563,706 B1 | 5/2003 | Strickler |
| 6,565,428 B2 | 5/2003 | Hsiao |
| 6,574,970 B2 | 6/2003 | Spinazzola et al. |
| 6,592,448 B1 | 7/2003 | Williams |
| 6,611,428 B1 | 8/2003 | Wong |
| 6,616,524 B2 | 9/2003 | Storck, Jr. et al. |
| 6,639,794 B2 | 10/2003 | Olarig et al. |
| 6,643,123 B2 | 11/2003 | Hartel et al. |
| 6,654,242 B2 | 11/2003 | Ogawa |
| 6,668,565 B1 | 12/2003 | Johnson et al. |
| 6,678,156 B2 | 1/2004 | Moizer |
| 6,700,779 B2 | 3/2004 | Hanson et al. |
| 6,717,807 B2 | 4/2004 | Hikawa |
| 6,722,151 B2 | 4/2004 | Spinazzola et al. |
| 6,745,579 B2 | 6/2004 | Spinazzola et al. |
| 6,788,535 B2 | 9/2004 | Dodgen et al. |
| 6,791,027 B1 | 9/2004 | Nicolai et al. |
| 6,796,437 B2 | 9/2004 | Krampotich et al. |
| 6,819,563 B1 | 11/2004 | Chu et al. |
| 6,867,966 B2 | 3/2005 | Smith et al. |
| 6,867,967 B2 | 3/2005 | Mok |
| 6,880,349 B2 | 4/2005 | Johnson et al. |
| 6,885,554 B1 | 4/2005 | Reeck et al. |
| 6,900,387 B2 | 5/2005 | Gravell et al. |
| 6,924,977 B2 | 8/2005 | Bestwick et al. |
| 6,927,980 B2 | 8/2005 | Fukuda et al. |
| 6,951,513 B1 | 10/2005 | Greenslade et al. |
| 6,987,673 B1 | 1/2006 | French et al. |
| 7,016,193 B1 | 3/2006 | Jacques et al. |
| 7,016,194 B1 | 3/2006 | Wong |
| 7,031,153 B2 | 4/2006 | Tanaka et al. |
| 7,033,267 B2 | 4/2006 | Rasmussen |
| 7,046,513 B2 | 5/2006 | Nishiyama et al. |
| 7,074,123 B2 | 7/2006 | Bettridge et al. |
| 7,085,133 B2 | 8/2006 | Hall |
| 7,096,678 B2 | 8/2006 | Petroski |
| 7,112,131 B2 * | 9/2006 | Rasmussen et al. .......... 454/184 |
| 7,184,267 B2 | 2/2007 | Patel |
| 7,187,547 B1 | 3/2007 | French et al. |
| 7,226,353 B2 | 6/2007 | Bettridge et al. |
| 7,236,362 B2 | 6/2007 | Wang et al. |
| 7,248,472 B2 | 7/2007 | Vinson et al. |
| 7,255,640 B2 * | 8/2007 | Aldag et al. ................. 454/184 |
| 7,259,961 B2 | 8/2007 | Lucero et al. |
| 7,286,345 B2 | 10/2007 | Casebolt |
| 7,330,350 B2 | 2/2008 | Hellriegel et al. |
| 7,362,571 B2 | 4/2008 | Kelley et al. |
| 7,372,695 B2 | 5/2008 | Coglitore et al. |
| 7,379,298 B2 | 5/2008 | Walsh et al. |
| 7,379,299 B2 | 5/2008 | Walsh et al. |
| 7,492,610 B2 | 2/2009 | Gilliland |
| 7,499,275 B2 | 3/2009 | Lai et al. |
| 7,724,516 B2 * | 5/2010 | Harder et al. .......... 361/679.51 |
| 7,862,410 B2 | 1/2011 | McMahan et al. |
| 7,878,888 B2 | 2/2011 | Rasmussen et al. |
| 7,894,190 B2 | 2/2011 | Davis et al. |
| 7,907,402 B2 | 3/2011 | Caveney |
| 7,957,139 B2 | 6/2011 | Davis et al. |
| 8,300,410 B2 * | 10/2012 | Slessman ..................... 361/691 |
| 2003/0124971 A1 | 7/2003 | Williams |
| 2003/0221817 A1 | 12/2003 | Smith et al. |
| 2005/0153649 A1 | 7/2005 | Bettridge et al. |
| 2005/0168945 A1 | 8/2005 | Coglitore |
| 2005/0170770 A1 | 8/2005 | Johnson et al. |
| 2005/0207116 A1 | 9/2005 | Yatskov et al. |
| 2005/0276017 A1 | 12/2005 | Aziz et al. |
| 2005/0286222 A1 | 12/2005 | Lucero et al. |
| 2006/0028797 A1 | 2/2006 | Chou |
| 2006/0056151 A1 | 3/2006 | Hara et al. |
| 2006/0227505 A1 | 10/2006 | Miyamoto et al. |
| 2006/0276121 A1 | 12/2006 | Rasmussen |
| 2007/0064389 A1 | 3/2007 | Lewis et al. |
| 2007/0064391 A1 | 3/2007 | Lewis, II et al. |
| 2007/0129000 A1 | 6/2007 | Rasmussen et al. |
| 2007/0171610 A1 | 7/2007 | Lewis |
| 2007/0173189 A1 | 7/2007 | Lewis |
| 2007/0293138 A1 | 12/2007 | Adducci et al. |
| 2008/0098763 A1 | 5/2008 | Yamaoka |
| 2008/0144280 A1 | 6/2008 | Walsh et al. |
| 2008/0259563 A1 | 10/2008 | Fukuda |
| 2009/0061755 A1 | 3/2009 | Calder et al. |
| 2010/0003911 A1 | 1/2010 | Graczyk et al. |
| 2010/0141105 A1 | 6/2010 | Slessman |
| 2010/0151781 A1 * | 6/2010 | Slessman et al. ............ 454/184 |
| 2010/0238626 A1 | 9/2010 | Linhares, Jr. et al. |
| 2010/0315788 A1 | 12/2010 | Vanderveen et al. |

FOREIGN PATENT DOCUMENTS

| | | |
|---|---|---|
| EP | 1727411 A2 | 11/2006 |
| JP | 55-138300 | 10/1980 |
| JP | 56-106495 | 8/1981 |
| JP | 01089599 A | 4/1989 |
| WO | 02054552 A1 | 7/2002 |
| WO | 20100470868 a1 | 4/2010 |

OTHER PUBLICATIONS

NetShelter SX Side Airflow Duct Kit (AR7715) drawing No. AR7715; Schneider Electric; 1 page; Nov. 30, 2009.

\* cited by examiner

THERMAL DUCTING SYSTEM

CROSS-REFERENCE TO RELATED APPLICATIONS

This application claims the benefit of U.S. Provisional Patent Application No. 61/647,557, filed on May 16, 2012, which is incorporated by reference in its entirety.

BACKGROUND OF THE INVENTION

The present invention relates to a thermal ducting system, and more particularly, a thermal ducting system having one or more strategically placed, selectively perforated baffles.

SUMMARY OF THE INVENTION

A thermal ducting system for electronic equipment in an electronic equipment enclosure is provided. The thermal ducting system includes a top duct, a bottom duct spaced apart from the top duct, a side duct extending from the top duct to the bottom duct and along an intake side of the electronic equipment, and at least one baffle positioned in the side duct.

DETAILED DESCRIPTION

Figure 1:
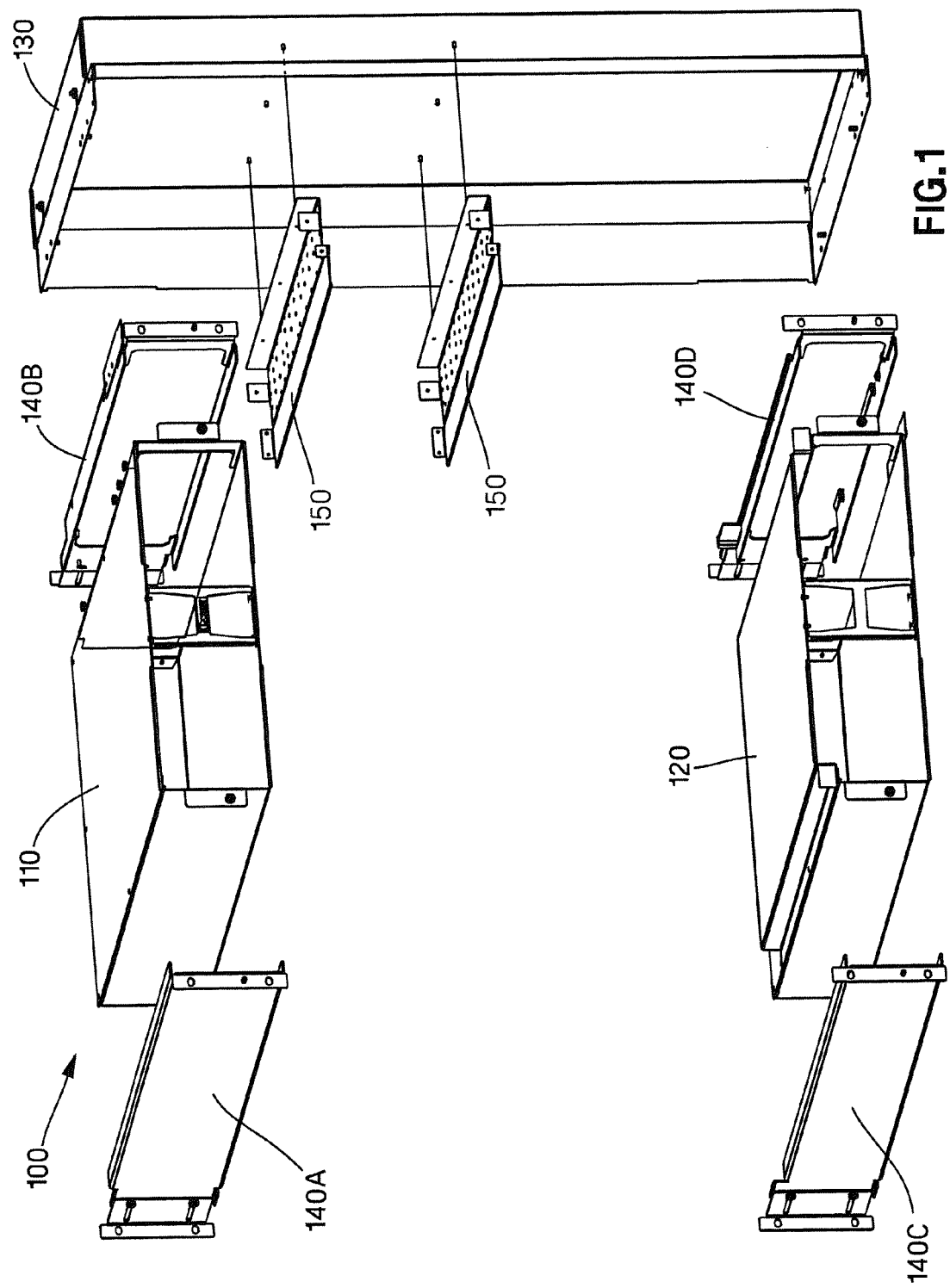
FIG. 1 is an exploded front left perspective view of a thermal ducting system according to an embodiment of the present invention.

As shown in FIG. 1, thermal ducting system 100 includes top duct 110, bottom duct 120, side duct 130, brackets 140A-140D, and baffles 150.

Figure 2:
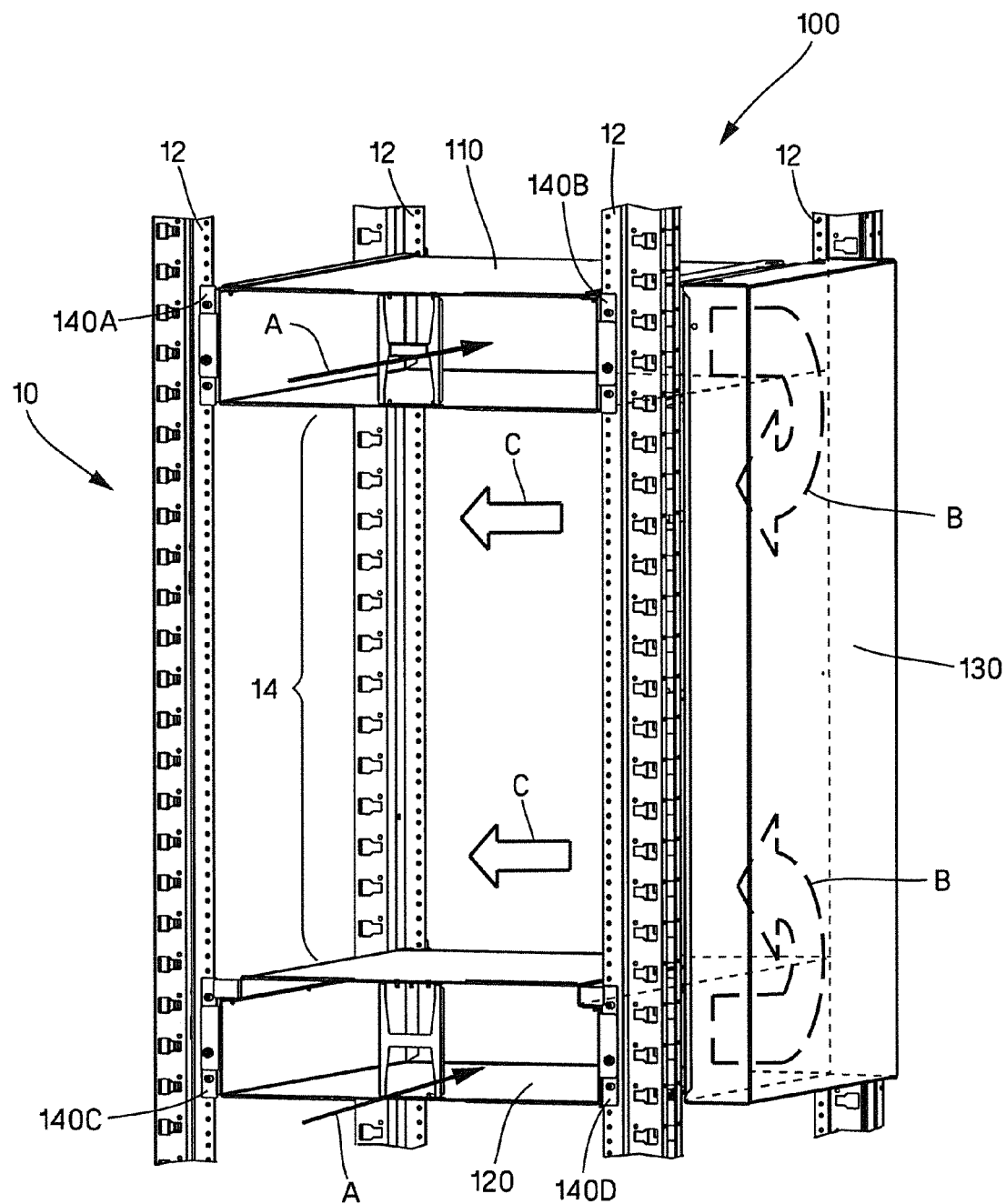
FIG. 2 is a front right perspective view of the thermal ducting system of FIG. 1 shown installed in a cabinet.

As shown in FIG. 2, thermal ducting system 100 is installed in cabinet 10, such as Panduit's Net-Access Cabinet. For example, to install thermal ducting system 100 in cabinet 10, brackets 140 are mounted to cabinet 10, and more particularly, to equipment rails 12 of cabinet 10, defining area 14 for receiving switch 20, such as Cisco's Nexus 7009 Switch. Next, side duct 130 is mounted to top right side bracket 140B and to bottom right side bracket 140D. Preferably, baffles 150 are installed in side duct 130 at the factory, but it is likewise contemplated that baffles 150 are installed in side duct 130 prior to installing side duct 130 in cabinet 10, for example, in the field. Next, top duct 110 is mounted to top left side bracket 140A and to top right side bracket 140B and bottom duct 120 is mounted to bottom left side bracket 140C and to bottom right side bracket 140D.

Figure 3:
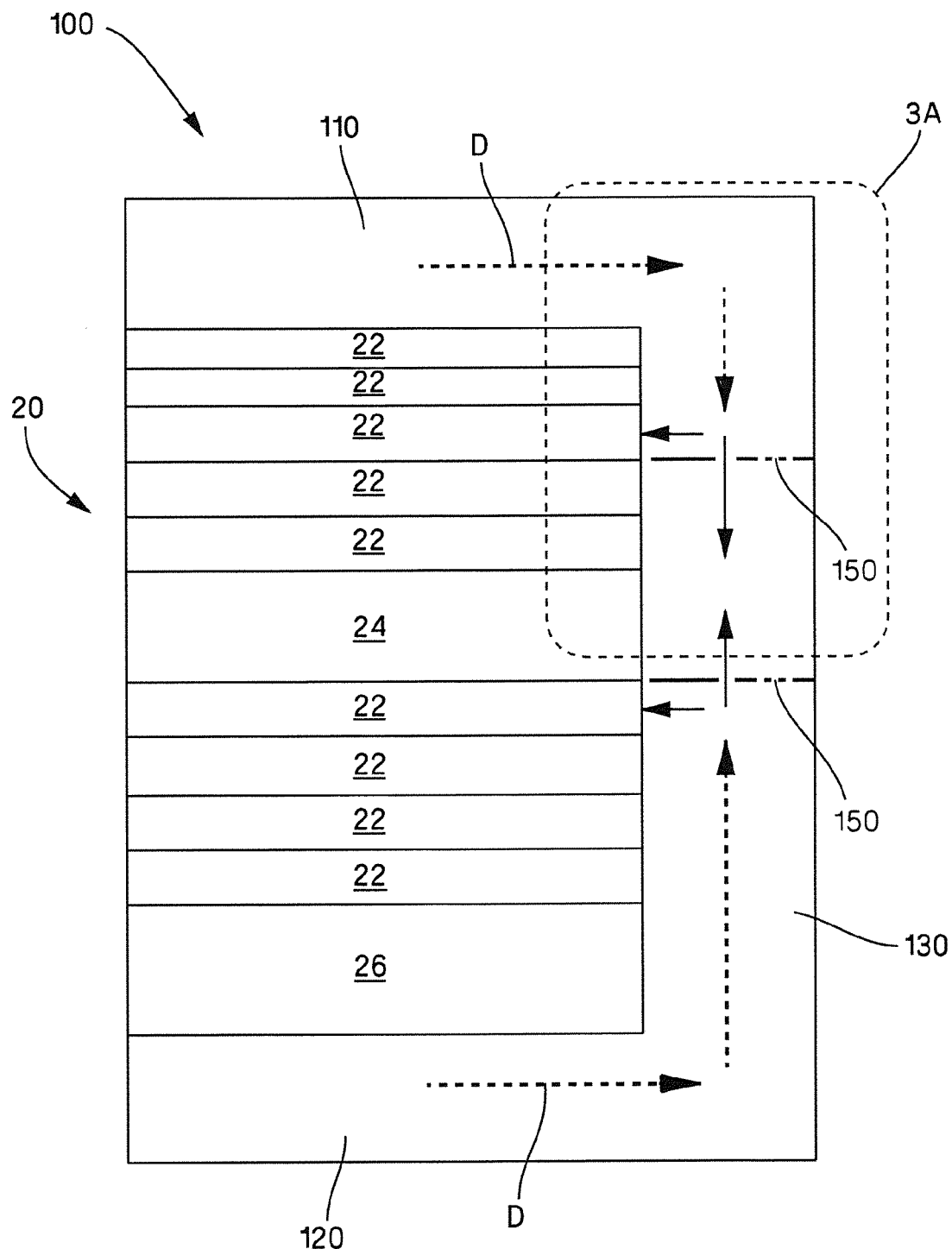
FIG. 3 is a side cross-sectional view of the thermal ducting system of FIG. 1 shown installed with a switch.

As shown in FIG. 3, switch 20 is installed in cabinet 10. Switch 20 is disposed in area 14 between top duct 110 and bottom duct 120 and adjacent side duct 130. The intake side of switch 20 is disposed adjacent side duct 130. Switch 20 includes line cards 22, fabric cards 24, and power supply 26.

Referring again to FIG. 2, thermal ducting system 100 routes cold air from the front of cabinet 10 to the intake side of switch 20. For example, cold air in the front of cabinet 10 is routed to top duct 110 and bottom duct 120, as indicated by arrows A. Next, the cold air in top duct 110 and bottom duct 120 is routed through side duct 130 and into the intake side of switch 20, as indicated by arrows B. Next, the cold air is routed through switch 20, as indicated by arrows C.

Referring again to FIG. 3, when cold air is routed from top duct 110 and bottom duct 120 to side duct 130, the cold air is moving at a relatively high velocity in a direction perpendicular to the intake side of switch 20, and more particularly, line cards 22, as indicated by arrows D. The relatively high velocity airflow has significant momentum and low static pressure, making it more difficult for switch 20 to draw in cold air to line cards 22, potentially causing an uneven airflow distribution across line cards 22. However, the addition of one or more strategically placed, selectively perforated baffles 150 reduces the velocity and increases the static pressure upstream of baffles 150, improving airflow to line cards 22 upstream of baffles 150.

Figure 3A:
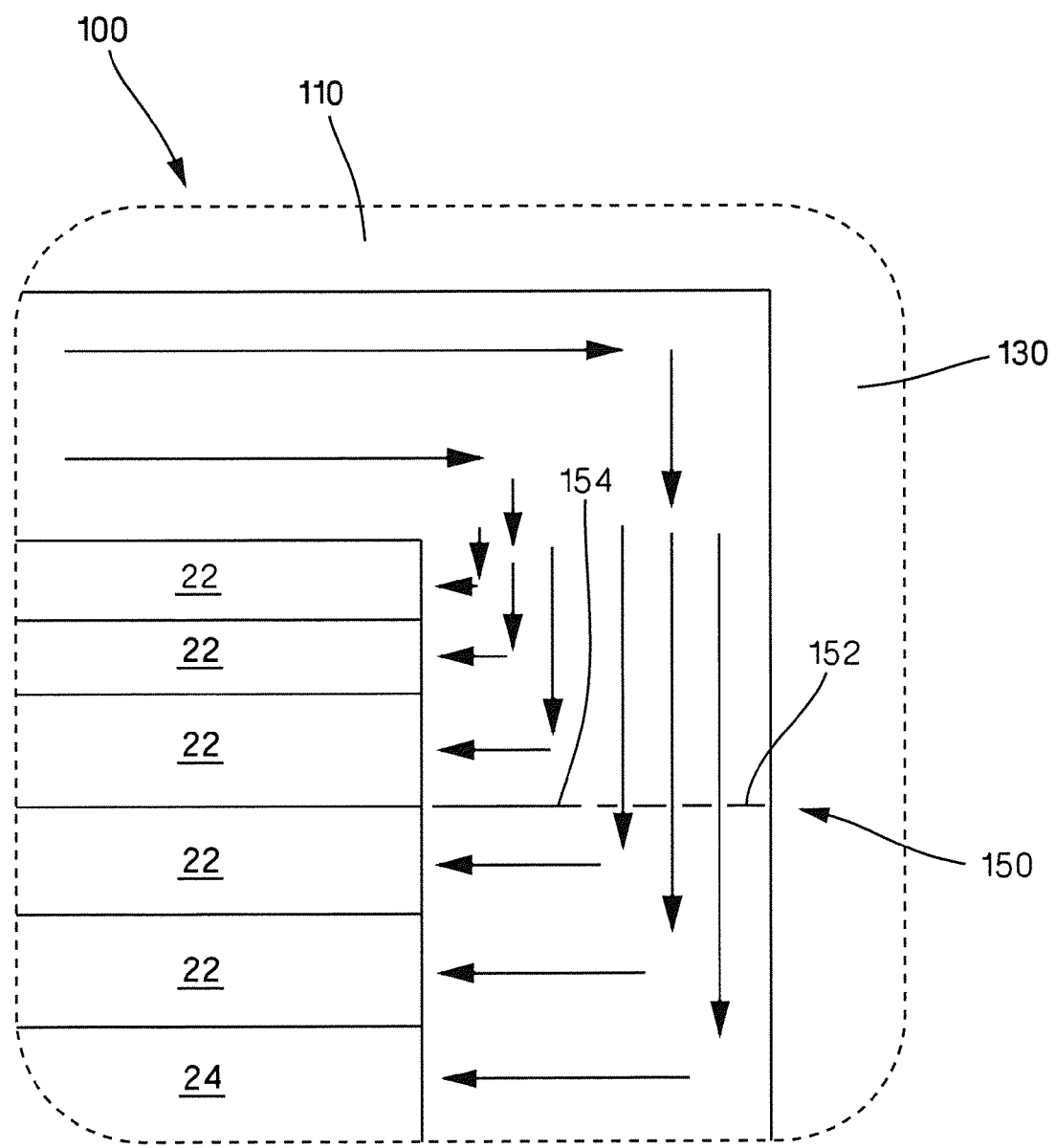
FIG. 3A is an enlarged view of detail 3A of FIG. 3.

As shown in FIG. 3A, baffle 150 is selectively perforated. That is, baffle 150 includes perforated portion 152 and imperforated portion 154. Perforated portion 152 allows cold air to pass through baffle 150 to line cards 22 and fabric cards 24 downstream of baffle 150. However, imperforated portion 154 does not allow cold air to pass through baffle 150, causing the cold air to stagnate, which improves airflow to line cards 22 upstream of baffle 150.

While this invention has been described in conjunction with the exemplary embodiments outlined above, various alternatives, modifications, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed is:

1. A thermal ducting system for electronic equipment in an electronic equipment enclosure, the thermal ducting system comprising:
   a top duct;
   a bottom duct spaced apart from the top duct,
   wherein the top duct and the bottom duct define an area for receiving the electronic equipment therebetween, and
   wherein the top duct and the bottom duct are in fluid communication with a front of the electronic equipment enclosure such that the top duct and the bottom duct receive cooled air from the front of the electronic equipment enclosure;
   a side duct extending from the top duct to the bottom duct and along an intake side of the electronic equipment,
   wherein the side duct is in fluid communication with the top duct and the bottom duct such that the side duct receives the cooled air from the top duct and the bottom duct; and
   at least one baffle positioned in the side duct perpendicular to the intake side of the electronic equipment,
   wherein the at least one baffle includes a perforated portion and an imperforated portion positioned between the perforated portion and the intake side of the electronic equipment.

2. The thermal ducting system of claim 1, wherein the at least one baffle is connected to the side duct.

3. The thermal ducting system of claim 1, wherein the at least one baffle includes a plurality of baffles.

4. The thermal ducting system of claim 1, wherein the electronic equipment includes a switch.

5. The thermal ducting system of claim 4, wherein the switch includes a power supply, a fabric card, and a plurality of line cards.

6. The thermal ducting system of claim 5, wherein the at least one baffle is positioned between intake openings for the power supply and the fabric card.

7. The thermal ducting system of claim 5, wherein the at least one baffle is positioned between intake openings for the fabric card and one of the plurality of line cards.

8. The thermal ducting system of claim 5, wherein the at least one baffle is positioned between intake openings for two of the plurality of line cards.

9. The thermal ducting system of claim 1, further comprising a pair of top brackets, the top duct connected to the pair of top brackets, the pair of top brackets connected to the electronic equipment enclosure.

10. The thermal ducting system of claim 9, further comprising a pair of bottom brackets, the bottom duct connected to the pair of bottom brackets, the pair of bottom brackets connected to the electronic equipment enclosure.

11. The thermal ducting system of claim 10, wherein the side duct is connected to one of the pair of top brackets and one of the pair of bottom brackets.

12. The thermal ducting system of claim 1, wherein the top duct, the bottom duct, and the side duct form a barrier for separating cooled air entering the electronic equipment and heated air exiting the electronic equipment.

13. A method of installing a thermal ducting system for electronic equipment in an electronic equipment enclosure, the method comprising:
   connecting a top duct to the electronic equipment enclosure;
   connecting a bottom duct to the electronic equipment enclosure, the bottom duct spaced apart from the top duct,
   wherein the top duct and the bottom duct define an area for receiving the electronic equipment, and
   wherein the top duct and the bottom duct are in fluid communication with a front of the electronic equipment enclosure such that the top duct and the bottom duct receive cooled air from the front of the electronic equipment enclosure;
   connecting a side duct to the electronic equipment enclosure, the side duct extending from the top duct to the bottom duct and along an intake side of the electronic equipment,
   wherein the side duct is in fluid communication with the top duct and the bottom duct such that the side duct receives the cooled air from the top duct and the bottom duct; and
   positioning at least one baffle in the side duct perpendicular to the intake side of the electronic equipment,
   wherein the at least one baffle includes a perforated portion and an imperforated portion positioned between the perforated portion and the intake side of the electronic equipment.

14. The method of claim 13, wherein the at least one baffle is positioned in the side duct before the side duct is connected to the electronic equipment enclosure.

* * * * *